March 11, 1969 M. DYRE 3,432,729
TERMINAL CONNECTIONS FOR AMORPHOUS SOLID-STATE SWITCHING DEVICES
Filed June 29, 1965
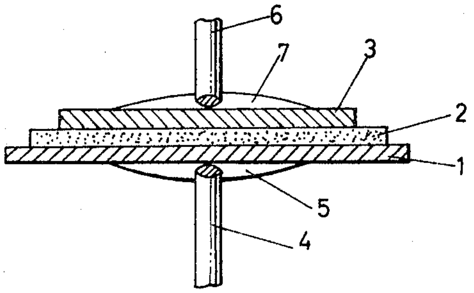

United States Patent Office 3,432,729

Patented Mar. 11, 1969

3,432,729

TERMINAL CONNECTIONS FOR AMORPHOUS SOLID-STATE SWITCHING DEVICES

Morgens Dyre, Gildbro, Nordborg, Denmark, assignor to Danfoss A/S, Nordborg, Denmark, a company of Denmark Filed June 29, 1965, Ser. No. 468,029
Claims priority, application Germany, July 4, 1964, D 44,893
U.S. Cl. 317—234 4 Claims
Int. Cl. H01l 5/00, 5/02, 7/16

ABSTRACT OF THE DISCLOSURE

A terminal connection for a solid state switching element, the switching element and a method of manufacturing the solid state switching element which is composed of a plurality of components. The switching element is made by evaporating the components on a metal plate in a vacuum vessel and evaporating a crystalline layer of at least one of the components in the same vacuum vessel on the evaporated components as a continuation for a longer period of the time of evaporation of the components. First a three component system is evaporated to form an amorphous layer on the plate and evaporation is continued with two of the three components to form a crystalline layer over the amorphous layer. The initial quantity and the evaporation temperature is adjusted such that the third component is consumed prior to the continued evaporation of the two components. The switching element comprises the metal plate, the layer of amorphous material formed from the components including germanium or silicon. A layer of crystalline material formed of at least one of the components or formed of a body of crystalline material compatible with the amorphous material and in contact therewith forms the terminal connection on the switching element.

The present invention relates to a contacting arrangement for solid state switching elements, and to a method for making the same, and more particularly for solid state switching elements composed of an amorphous, that is noncrystalline body.

Solid state switching elements formed of an amorphous, that is non-crystalline body are bi-laterally conducting, that is they do not have rectifying properties. Such switching elements can switch from a low resistance state to a high resistance state depending upon the electrical potential applied thereacross; and revert back to their high resistance state depending upon the current therethrough either falling below a certain holding value, or exceeding a second, switching-off threshold value.

One form of solid state switching elements which can change from a high resistance to a low resistance state can be built up of a plurality of monocrystalline layers, for example, 5-layer diodes. The switching elements made of amorphous material however have certain advantageous properties, one of which being their ease of manufacture. When, for the purpose of this specification, the term "amorphous," or "non-crystalline" is used, it is to be understood that neither microscopic nor X-ray diffraction tests reveal a crystalline strcuture; it is possible however that such solid state switches may be composed of small, very fine polycrystalline material, and such material is to be deemed included within the meaning of "amorphous" for the purposes of this specification.

The materials useful as components of such switching elements are for example tellurium and germanium; tellurium-arsenic-germanium; cadmium-arsenic-germanium;

zinc-arsenic-germanium, or the like. The germanium may also be replaced by silicon.

The solid state switching elements built up of the aforementioned components may present difficulties in securing electrical contacts thereto. The usual methods of contacting semiconductor devices, for example, diffusion, soldering, or thermal compression contacts are not suitable because they interfere with the functioning of the solid state switching element; for example, indium in a solder connection, and gold in thermal compression contact, diffuse into the solid state material.

It is an object of the present invention to provide a contacting arrangement for solid state switching elements utilizing amorphous materials, and a method for applying such contacts.

Briefly, in accordance with the present invention, a surface contact with the amorphous material is established by a crystalline body consisting of a material which is compatible with the amorphous material, for example, a crystalline body consisting of one or more of the components of the amorphous material.

In accordance with a feature of the invention, a mixture of the components to form the amorphous solid state switching elements is evaporated in a vacuum vessel on a metal plate; the evaporation is continued with the one material only which is to form the crystalline layer in such a manner as to provide a crystalline layer over the amorphous, non-crystalline body of material. A contact, in accordance with semi-conductor technology, is then applied to the layer of crystalline material.

The single figure illustrates a section through a solid state switching element having contacts applied thereto in accordance with the present invention.

A layer of solid state switching element material 2 is evaporated or vacuum deposited on a metal plate 1 in a vacuum chamber. A crystalline electrode layer 3 is thereafter evaporated over layer 2. Metal plate 1, which also serves as a support, is provided with a connecting wire 4 by means of an ordinary solder connection 5. The crystalline electrode layer 3 has a connecting wire 6 applied thereto by means of a solder connection 7 made in accordance with semi-conductor technology. The layer of solid state switching element may consist, for example, of 67.5% tellurium, 25% arsenic, and 7.5% germanium. The crystalline layer 3 may, for example, consist only of tellurium and arsenic.

The element is made in this manner: first, all three components, that is tellurium, arsenic and germanium are evaporated in a vacuum chamber. The quantity, and the heating of the germanium is regulated in such a manner that it evaporates before the other two components are completely evaporated and used up. A crystalline layer consisting then only of tellurium-arsenic will be formed above the amorphous layer of tellurium-arsenic-germanium.

The crystalline layer does not contribute to the electrical switching of the element. It is, however, compatible with the material of the solid state switching element and, because of its crystalline structure, does not only form an electrically conductive transition zone, but also a protective layer which permits use of methods known in the semi-conductor art to protect the switching element. For example, by use of indium a solder connection can be made to the crystalline layers; or a hot gold wire may be applied by means of an edge, under compression, to form a thermal compression bond, as is known in the semi-conductor art; alternatively, contact metal may be electroplated or sputtered over the crystalline layer.

The choice of the material for the crystalline layer ordinarily does not present difficulties. Preferably, it consists of a pair of components of the solid state switching element, which is a multi-component unit. Use it made of the fact that, in a three component system, two components form definite crystals with each other and only the addition of the third component causes transition into the amorphous condition. For example, cadmium and arsenic together or zinc and arsenic together form crystals; when germanium, or silicon is added, they however do not form the crystals and remain amorphous. The conditions for conductivity of the crystal system, and furthermore of compatibility with the amorphous system are thus met. It is also possible to form the crystalline layer essentially of carbon, for example, by precipitating carbon from a carbon containing atmosphere at elevated temperature. Carbon, in this case, is compatible with the amorphous solid state switching element and is neutral.

What is claimed is:

1. A terminal connection for a solid state switching element, said solid state switching element comprising a multi-component body of amorphous material; said terminal connection comprising a body of crystalline material compatible with said amorphous material and having a surface to surface contact with said amorphous material; said crystalline material comprising carbon; and means forming a terminal connection to said crystalline material.

2. An article of manufacture forming a solid state switching element comprising a metal plate; a layer of amorphous material formed of a plurality of components taken from the group consisting of germanium or silicon; a layer of crystalline material formed of at least one of said components in surface contact with said amorphous layer; said layer of amorphous material comprising a material taken from the group consisting of tellurium-germanium, tellurium-arsenic-germanium, cadmium-arsenic germanium, zinc-arsenic-germanium, tellurium-arsenic-silicon, cadmium-arsenic-silicon, zinc-arsenic-silicon, said layer of crystalline material comprising a material taken from the group consisting of arsenic, cadmium-arsenic, zinc-arsenic; and a metal lead connected to said layer of crystalline material.

3. Method of manufacturing a solid state switching element composed of a plurality of components comprising evaporating said components on a metal plate in a vacuum vessel; evaporating a crystalline layer of at least one of said components in the same vacuum vessel on said evaporated multiple components, and the evaporation step of at least said one component comprising a continuation for a longer period of the time of evaporation of the components.

4. Method according to claim 3 wherein first a three component system is evaporated to form an amorphous layer on said plate; and evaporation is continued with two of the three components to form a crystalline layer over said amorphous layer; the initial quantity and the evaporation temperature being adjusted such that the third component is consumed prior to the continued evaporation of said two components.

References Cited

UNITED STATES PATENTS

| | | | |
|---|---|---|---|
| 2,780,569 | 2/1957 | Hewlett | 148—1.5 |
| 3,009,840 | 11/1961 | Emeis | 148—1.5 |
| 3,202,854 | 8/1965 | Ochs | 313—65 |
| 3,271,591 | 9/1966 | Ovshinsky | 307—88.5 |
| 3,271,632 | 9/1966 | Hartmann | 317—234 |
| 3,327,137 | 6/1967 | Ovshinky | 307—88.5 |
| 3,327,302 | 6/1967 | Ovshinky | 340—347 |

JOHN W. HUCKERT, *Primary Examiner.*

R. SANDLER, *Assistant Examiner.*

U.S. Cl. X.R.

20—589